United States Patent [19]

Wynne et al.

[11] Patent Number: 4,990,916
[45] Date of Patent: Feb. 5, 1991

[54] SINGLE-SUPPLY DIGITAL-TO-ANALOG CONVERTER FOR CONTROL FUNCTION GENERATION

[75] Inventors: John M. Wynne, Dooradoyle; Michael Byrne, Ballysheedy, both of Ireland

[73] Assignee: Analog Devices, BV, Limerick, Ireland

[21] Appl. No.: 472,364

[22] Filed: Jan. 30, 1990

[51] Int. Cl.$^5$ .............................................. H03M 1/66
[52] U.S. Cl. ..................................... 341/147; 341/151; 341/136; 341/154
[58] Field of Search ............... 341/133, 134, 135, 136, 341/142, 144, 147, 151, 153, 154

[56] References Cited

U.S. PATENT DOCUMENTS

| | | | |
|---|---|---|---|
| 3,548,169 | 12/1970 | Togneri | 341/142 |
| 4,034,365 | 7/1977 | Grandy | 341/151 |
| 4,635,038 | 1/1987 | Wincn | 341/136 |
| 4,644,325 | 2/1987 | Miller | 341/133 |

FOREIGN PATENT DOCUMENTS

61-218229  9/1986  Japan ..................... 341/154

Primary Examiner—William M. Shoop, Jr.
Assistant Examiner—H. L. Williams
Attorney, Agent, or Firm—Wolf, Greenfield & Sacks

[57] ABSTRACT

A converter for producing the function $V_{out} = V_{bias} = V_{swing}(1-2D)$, in which a DAC is combined with an operational amplifier and (typically) three or four resistors. A function of the voltage $V_{swing}$, or a current corresponding thereto, is applied to the reference voltage input terminal of the DAC. The variable D is the DAC's digital input code, expressed as a decimal or fraction in the range between 0 and 1. The DAC output provides a suitably scaled and signed signal which is added to or subtracted from the offset signal $V_{bias}$ to produce $V_{out}$.

3 Claims, 5 Drawing Sheets

SINGLE-SUPPLY DIGITAL-TO-ANALOG CONVERTER FOR CONTROL FUNCTION GENERATION

BACKGROUND OF THE INVENTION

1. Field of the Invention

This invention relates to the field of digital to analog conversion and, in particular, to converters adapted for use in disk drive controllers and similar applications, such as many servo systems, where a need exists for an output voltage function of the form $V_{out} = V_1 + V_2(1-2D)$ or $V_{out} = V_1 - V_2(1-2D)$, where both $V_1$ and $V_2$ may be supplied as input variables and D is function from 0 to 1, supplied as a digital value to control a DAC.

2. Discussion of the Prior Art

Digital-to analog converters are needed in many applications. Of particular interest herein is their use in control systems, such as electro-mechanical servo mechanisms. In recent years, the use of digital servo techniques has become widespread to control disk drive read/write head positioners (i.e., actuators) and spindle motors. Handling the analog signals for driving such transducers requires the use of analog-to digital converters (ADC's), digital to analog converters (DAC's), operational amplifiers, logic functions and discrete components. The combination of these elements can take up a large section of precious board space in a hard disk drive system.

In a hard disk drive system, the disk heads produce low level analog signals that are amplified and are subsequently passed through detection and demodulation circuits prior to being converted to digital form. The digital data is then supplied to a servo micro controller that computes position and velocity of the read/write head. The micro-controller executes a control algorithm which takes as input the position and velocity information and outputs control data to a DAC which then drives the power amplifier that operates the read/write head actuator, to position the read/write head accordingly. One basic need for disk drive applications, therefore, is a DAC which, at half scale, presents an output sitting at some defined bias point $V_{bias}$. This bias voltage establishes a zero-error position of the read/write head. With a half scale digital code applied to the DAC, the head is presumed to be directly over the data track. Feedback acts to increase or decrease the DAC code, to keep the head centered over the data. The magnitude of the DAC output voltage swing obviously depends on the individual system parameters and is essentially another independent variable, $V_{swing}$. An ideal disk drive DAC thus provides an output voltage given either by the formula $V_{out} = V_{bias} + V_{swing}(1-2D)$ or by the formula $V_{out} = V_{bias} - V_{swing}(1-2D)$, where D represents the equivalent fractional value of the full scale DAC resolution indicated by the digital code applied to the DAC and ranges between 0 and 1. Hereinafter, therefore, we shall use the simplified expression "$V_{out} = V_{bias} \pm V_{swing}$" as a way of saying that the function is $V_{out} = V_{bias} + V_{swing}(1-2D)$ or $V_{out} = V_{bias} - V_{swing}(1-2D)$. $V_{swing}$ defines the span of the signal, $V_{bias}$ is a DC reference level on which the $V_{swing}$ signal is superimposed and the composite signal can thus span the range between $V_{bias} - V_{swing}$ to $V_{bias} + V_{swing}$ (i.e., as D varies between 1 and 0).

The disk drive application is a specific case of the more general situation in which a DAC is needed to supply an output which is offset from zero (by some predetermined amount) when a zero code input is provide to the DAC.

Figure 1:
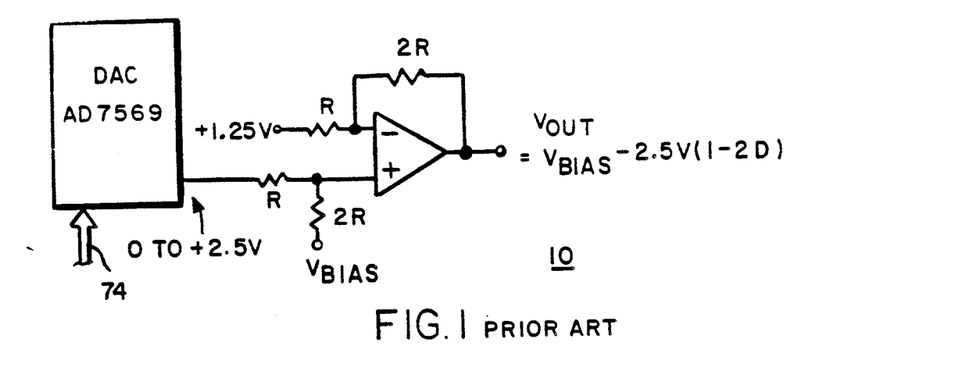
FIG. 1 a schematic circuit diagram for a prior art circuit which provides the function $V_{out} = V_{bias} - 2.5 v (1-2D)$, where D is the decimal or fractional equivalent value of the digital code supplied to the DAC.
Figure 2:
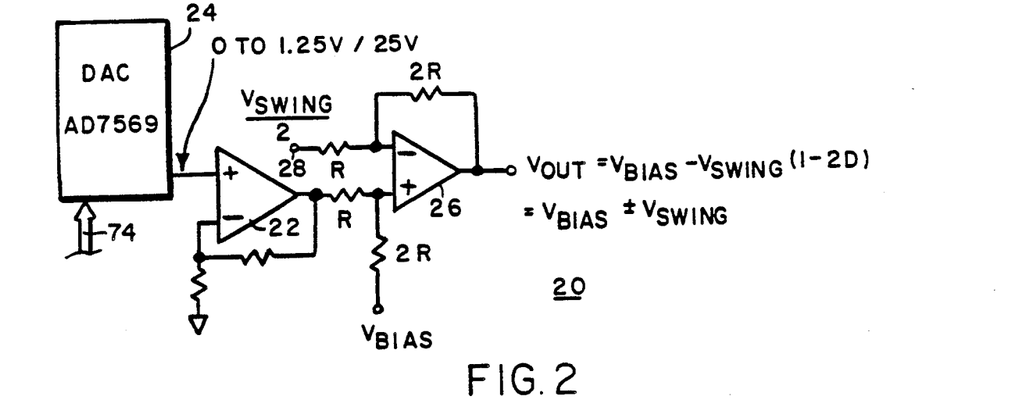
FIG. 2 is a schematic circuit diagram for a first prior art circuit which provides the function $V_{out} = V_{bias} - V_{swing}(1-2D)$.
Figure 3:
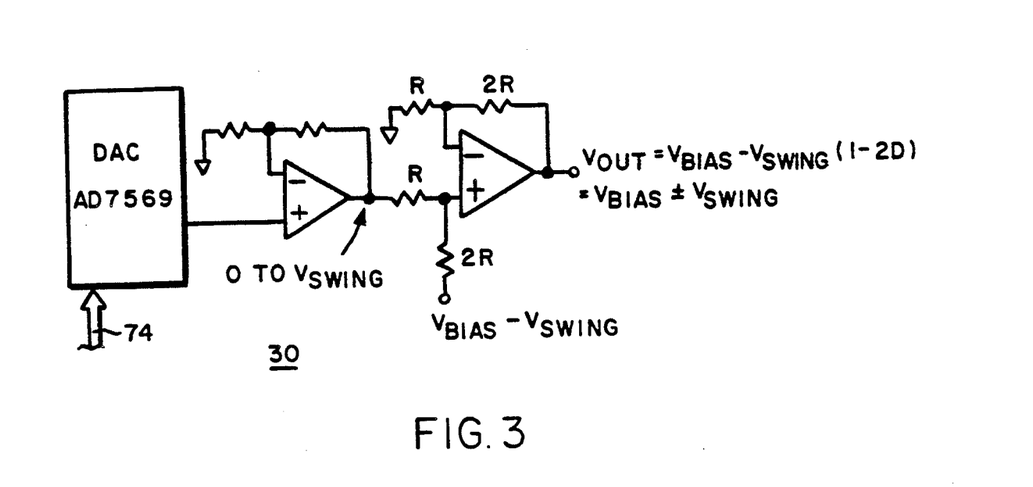
FIG. 3 is a schematic circuit diagram for a second prior art circuit which provides the function $V_{out} = V_{bias} - V_{swing}(1-2D)$

Traditional ADC's and DAC's require additional signal conditioning circuits to interface with these signals, since they only handle ground referenced or differential input signals. In order to get an output range of $V_{bias} \pm V_{swing}$ from a conventional DAC such as the model AD7569 DAC from Analog Devices, Inc., of Norwood, Mass., at least three solutions exist. The first solution is shown in FIG. 1. There, the circuit 10 provides an output range of $V_{bias} \pm 2.5$ volts. The circuit is thus limited in that it can provide only a predefined $\pm 2.5$ volt swing, rather than a swing which is arbitrarily set (within some predetermined limits) by application of a variable voltage $V_{swing}$. Additionally, an external reference of +1.25 volts has to be provided. If the external reference does not match the internal reference, the swing will not be symmetrical about $V_{bias}$. The restricted swing can be overcome by the circuit 20 of FIG. 2. This circuit provides an additional op-amp 22 to generate a zero to $V_{swing}$ output range from the zero to +1.25 volt output of the DAC 24. This circuit, however, also has the problem of matching the two reference voltages, since the output of op-amp 26 will not swing symmetrically about $V_{bias}$ unless the $V_{swing}/2$ signal applied at node 28 is matched to the output of op-amp 22. An alternative is the circuit 30 of FIG. 3 which, instead of requiring a $V_{swing}/2$ voltage requires a $V_{bias} - V_{swing}$ voltage at the input. However, an additional operational amplifier (not shown) is probably required to generate this difference voltage. Again, the circuit suffers from having to match the internal reference (gain adjusted to produce $V_{swing}$ DAC output) with the external $V_{swing}$ voltage.

Figure 4:
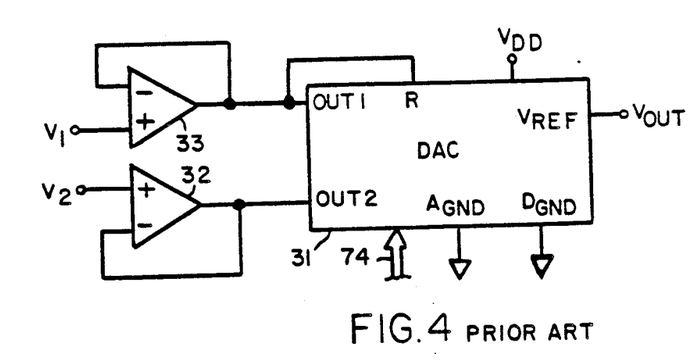
FIG. 4 is a schematic circuit diagram for a third prior art circuit which under some conditions provides the same function.

An approach published in *CMOS DAC Application Guide*, Analog Devices, Inc., Norwood, Mass., 1984 at 20 (Analog Devices Pub. No. G872-30 10/84), is shown in FIG. 4. There, a voltage switching circuit is shown. The OUT2 terminal of DAC 31 is driven by a lower offset voltage $V_2$ via buffer 32, and the OUT1 terminal is driven by a full scale output voltage via buffer 33. If the DAC ladder termination resistor is connected to the AGND terminal, the output voltage $V_{out}$ for a given digital input code D is given by:

$$V_{out} = D(V_1 - V_2) + (1 - 2^{-n})V_2.$$

Thus, $$V_{out} = V_2(1 - 2^{-n}) \text{ when } D = 0 \text{ and } V_{out} = V_1 \text{ when } D = 1 - ^{-n}.$$

If the ladder termination resistor is connected to the DAC's OUT2 terminal, the output voltage is given by:

$$V_{out} = D(V_1 - V_2) + V_2.$$

Thus, $$V_{out} = V_2 \text{ when } D = 0, \text{ and}$$
$$V_{out} = V_1(1 - 2^{-n}) + V_2(2^{-n})$$
$$\text{when } D = 1 - 2^{-n}.$$

Consequently, the end points of the span are $V_2$ and approximately $V_1$. In other words, the inputs are not conveniently $V_{bias}$ and $V_{swing}$ but, rather, are functions which must be derived from those variables (using additional components, not shown). Moreover, the outputs of buffers 32 and 33 should never go negative with respect to OUT2 or parasitic action may damage the DAC.

Figure 5:
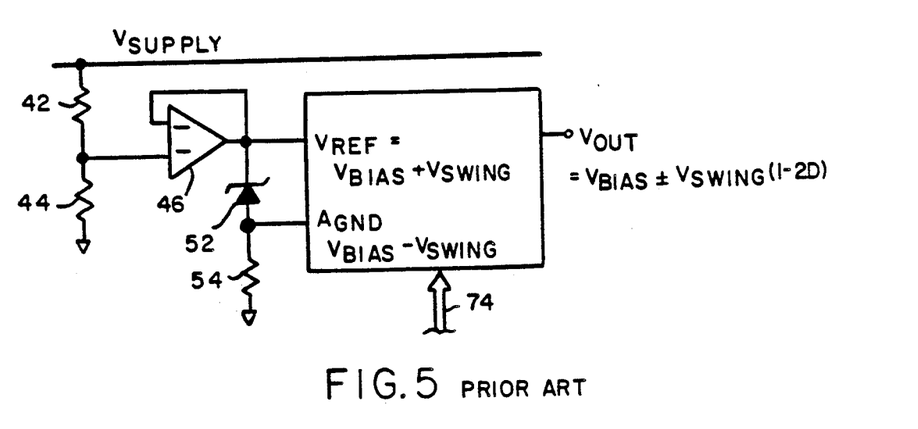
FIG. 5 is a schematic circuit diagram of still a fourth prior art circuit which under appropriate conditions provides the same function.

Another approach is shown in FIG. 5, which is a variant of the circuit of FIG. 4 in which $V_1 = V_{bias} + V_{swing}$ and $V_2 = V_{bias} - V_{swing}$. A resistive divider formed of resistors 42 and 44 supplies via buffer amplifier 46 a voltage $V_{bias} + V_{swing}$ to the reference voltage input of a DAC 50 and to the anode of a Zener diode 52. The cathode of the Zener diode 52 is connected to ground through a resistor 54 and to the analog ground terminal (AGND) of DAC 50. When $V_{bias} + V_{swing}$ is adequate to keep the diode 52 conducting, the output $V_{drive} = V_{bias} \pm V_{swing}$. Of course, this circuit is limited in that $V_{swing}$ is established by the Zener diode 52 (where $V_{zener} = 2 V_{swing}$) and cannot be supplied as a variable input on a signal lead. Additionally, $V_{swing}$ must be a positive voltage. FIG. 5 essentially shows an approach published in M. Byrne, *AD7224 Provides Programmable Voltages over Varying Ranges*, Analog Devices, Inc., Norwood, Mass. 198, Analog Devices Application Note No. E910-15-5/85.

For disk drive (and many other servo) applications, the ability to provide both $V_{bias}$ and $V_{swing}$ as variable values is important. Further, the DAC should be capable of operating from a standard single sided supply voltage in order to avoid creating an unnecessary need for a second supply voltage. A DAC requiring both positive and negative supplies would, for most applications, not be commercially acceptable.

OBJECTS AND SUMMARY

Accordingly, it is an object of the invention to provide an improved DAC for hard disk drive servos and other similar servo systems.

A further object of the invention is to provide a DAC which operates from a single sided supply and is capable of supplying as an output a signal of the form $V_{bias} \pm V_{swing}$, or equivalently $V_{bias} + V_{swing}(1-2D)$ or $V_{bias} - V_{swing}(1-2D)$, where $V_{bias}$ and $V_{swing}$ represent voltages which are applied to the DAC as input variable and D is a fractional code from 0 to 1.

Yet another object of the invention is to provide an improved DAC which is capable of supplying as an output a signal of the for $V_{bias} \pm V_{swing}$, where the output varies symmetrically Still another object of the invention is to provide an improved DAC which is capable of supplying as an output a signal of the for $V_{bias} \pm V_{swing}$, where the need to carefully match voltages and/or components is minimized.

The foregoing objects are achieved in several simple but effective circuits which constitute alternative embodiments of the invention. In each embodiment, a DAC is combined with an operational amplifier and (typically) three or four resistors. The voltage $V_{swing}$, or a current corresponding thereto, is applied to the reference input terminal of a DAC. The DAC output provides a suitably scaled and signed signal which is then added to the offset signal $V_{bias}$.

The operation and advantages of the present invention will become more fully understood from the detailed description below, which should be read in conjunction with the accompanying drawing.

DETAILED DESCRIPTION

Figure 6:
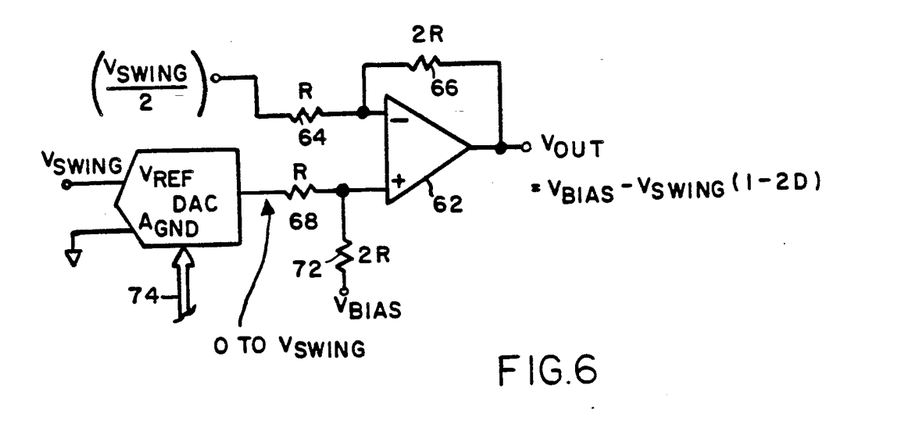
FIG. 6 is a schematic circuit diagram of a first embodiment according to the present invention.

The schematic circuit diagram for a first embodiment of the present invention is shown in FIG. 6, from which it will be seen that the invention is made from a DAC 60, an operational amplifier 62, and four resistors: 64, 66, 68 and 72. Resistors 64 and 68 have a resistance value R and resistors 66 and 72 have a resistance value 2R. DAC 60 is a multiplying DAC controlled by, for example, an 8-bit digital word supplied via a data input bus 74. The output of DAC 60 is the voltage applied to the reference input $V_{ref}$ (i e., $V_{swing}$) multiplied by a factor D, which ranges from 0 to $(2^n-1)/2^n$, where n is the resolution of the DAC, in bits. The factor D equals the decimal equivalent of the code on bus 44, divided by $2^n$. The following equations show how the output voltage varies from $V_{bias} - V_{swing}$ to $V_{bias} + V_{swing}$, as D varies from 0 to ½ to 1:

$$\text{for } D = 0, V_{out} = \tfrac{1}{2}(V_{bias})3 - 2(V_{swing}/2)$$
$$= V_{bias} - V_{swing}$$

-continued for $D = \frac{1}{2}$, $V_{out} = \frac{1}{3}(V_{bias})3 +$
$(V_{swing}/2)(\frac{2}{3})(3) - V_{swing}$
$= V_{bias}$ for $D = 1$, $V_{out} = V_{bias} + V_{swing}$ Intermediate the D values $D = 0$ and $D = \frac{1}{2}$, on the one hand, and $D = \frac{1}{2}$ and $D = 1$, on the other, the output smoothly varies from $V_{bias} - V_{swing}$ to $V_{bias}$, on the one hand, and from $V_{bias}$ to $V_{bias} + V_{swing}$, on the other.

Figure 7:
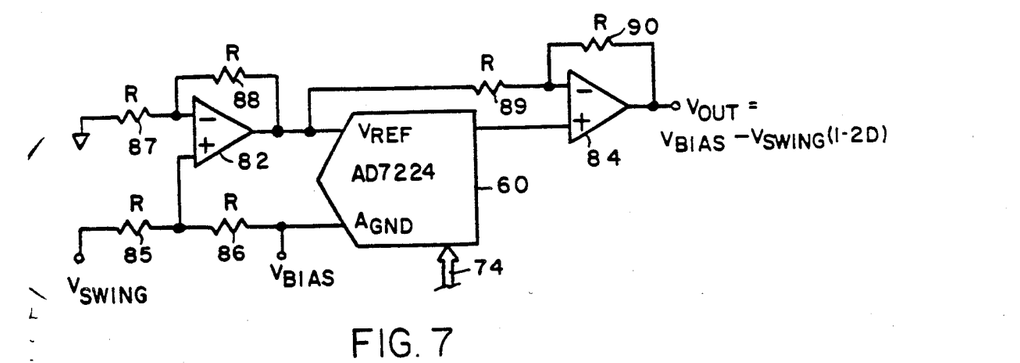
FIG. 7 is a schematic circuit diagram of a second embodiment of the present invention.

A variation on the circuit theme of FIG. 6 is shown in FIG. 7. There, however, in addition to a DAC 60, the circuit requires two op-amps 82 and 84, as well as six resistors 85-90, all of which must be trimmed to the same value.

Figure 8:
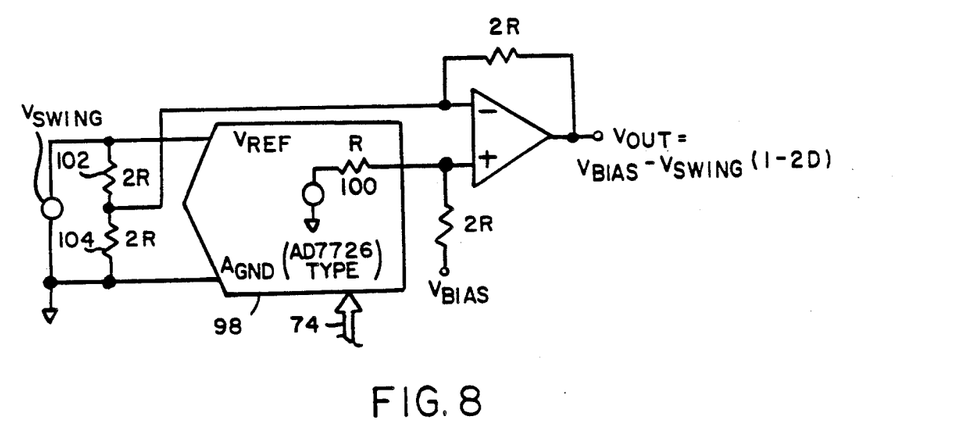
FIG. 8 is a schematic circuit diagram of a third embodiment of the present invention.

As shown in FIG. 8, a simplification of the circuit of FIG. 6 can be achieved, if the DAC 98 output impedance 100 is not zero (as assumed in FIG. 6) but instead is a value R which then may be used as one of the "R's 38 in the DAC output divider. Thus in both FIG. 6 and FIG. 8 we may say that the DAC output is provided to the non inverting input of the op-amp through a resistor of resistance R. Further, the resistor 64 of resistance R can be replaced by two parallel resistors of value 2R each. Thus, the $V_{swing}/2$ signal can be obtained from a simple voltage divider formed by resistors 102 and 104, each of resistance 2R, placed in series across the $V_{ref}$ and analog ground (AGND) terminals to which the $V_{swing}$ signal is applied. For incremental purposes, resistors 102 and 104 are actually in parallel, providing an incremental resistance R between a $V_{swing}/2$ source and the inverting input of op-amp 106, just as the same incremental resistance is employed in FIG. 6.

Since the user can separately specify $V_{bias}$ and $V_{swing}$ as input variables, he or she has great flexibility in handling different input and output signal levels. The voltage $V_{bias}$ can be drawn from the reference voltage available in the disk drive system, which is normally 5 to 6 V. Like the circuits of FIGS. 1-5, only positive supply voltages are required for the circuits of FIGS. 6 13, making these circuits useful in the numerous situations where only positive supply voltages are available, typically from a single supply.

Figure 9:
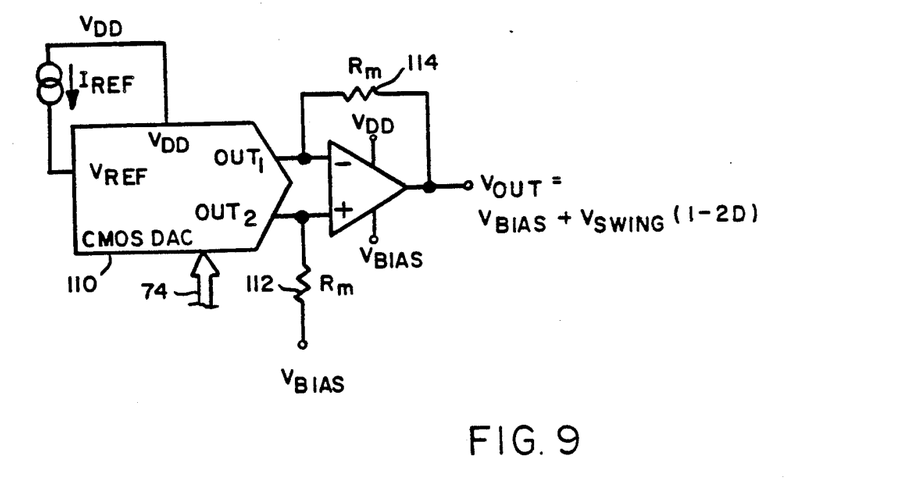
FIG. 9 is a schematic circuit diagram of a fourth embodiment of the invention, employing a CMOS DAC.

Another circuit which provides the same output function is shown in FIG. 9. The DAC 110 is a standard CMOS R-2R ladder DAC, such as the Model AD7240 DAC from Analog Devices, Inc. The reference current $I_{ref}$ is determined by the required voltage swing $V_{swing}$ and is given as $I_{ref} = V_{swing}/R_m$, where $R_m$ is the value of the matched resistors 112 and 114. $R_m$ is independent of the DAC ladder resistance.

If in FIG. 9 $I_{ref}$ is made to be a current out of the terminal to ground (instead of into the DAC from $V_{DD}$), the complementary output function is obtained—i.e., $V_{out} = V_{bias} - V_{swing}(1-2D)$.

Figure 10:
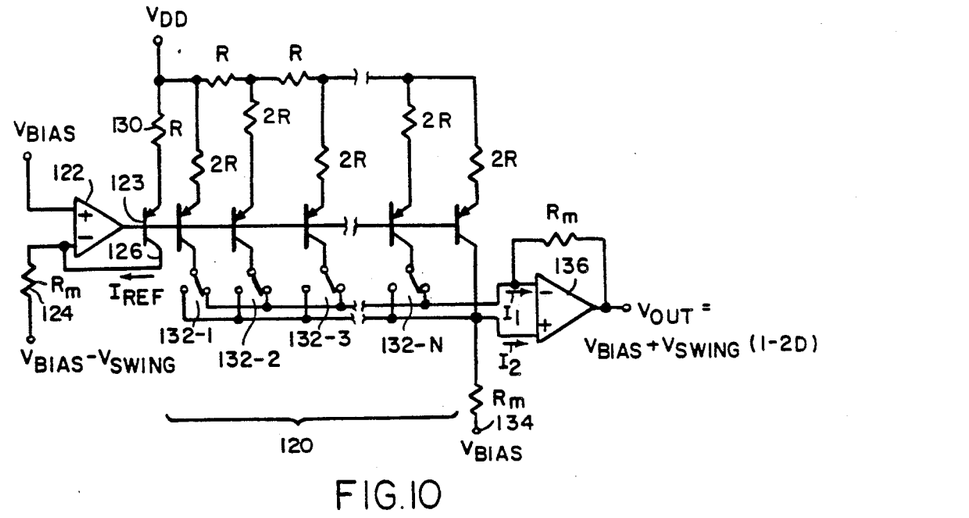
FIG. 10 is a schematic circuit diagram for a fifth embodiment of the invention.

FIG. 10 shows a variation of the circuit of FIG. 9, wherein a bipolar DAC 120 is used and the current $I_{ref} = V_{swing}/R_m$ is provided by a transconductance amplifier formed by op-amp 122 and transistor 123, the latter being the reference transistor in the DAC. The output of op-amp 122 also biases the bases of all of the common emitter transistors in each leg of the DAC (i.e., connected to each 2R resistor in the R−2R ladder). Op-amp 122 has a differential input. The non inverting input receives the voltage $V_{bias}$; the inverting input receives the voltage $V_{bias} - V_{swing}$ (which can be generated by another op-amp, not shown). The voltage across resistor 124 (whose resistance is $R_m$) is substantially equal to $V_{swing}$, since there is essentially no voltage drop across the amplifier inputs. Further, since there is virtually no input current to the amplifier due to its high impedance, the current $V_{swing}/R_m$ through resistor 124 must be supplied via feedback path 126, as the collector current in transistor 123. Substantially the same current is pulled through emitter resistor 130 and, thus, through the DAC resistor ladder, where it divides up in accordance with the positions of DAC switches 132 1 through 132-n. An offset voltage $V_{bias}$ is applied at terminal 134 and is superimposed at the non inverting input of amplifier 136 with the voltage induced by the difference in DAC output currents $I_1$ and $I_2$, to provide the output signal $V_{out}$ of the form discussed above.

Figure 11:
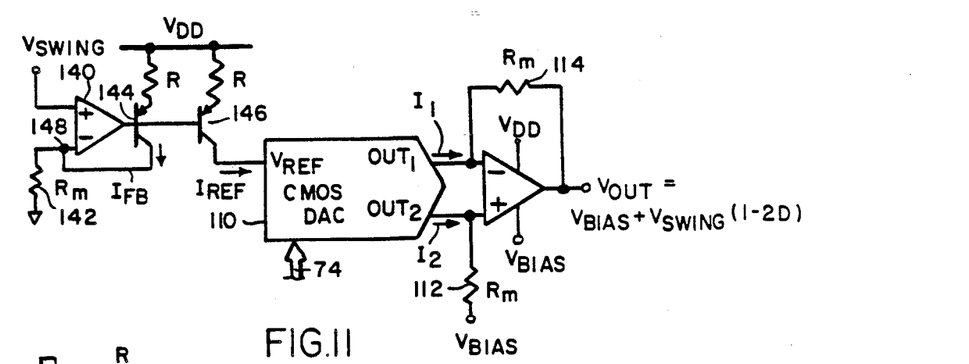
FIG. 11 is a schematic circuit diagram of the converter of FIG. 9 with the addition of a circuit for the current source.

Implementation of the circuit of FIG. 9—i.e., a converter using a CMOS DAC, is dependent on proper formulation of a current source for $I_{REF}$, since $V_{OUT}$ has the desired form only if $I_{REF} = V_{swing}/R_m$. FIG. 11 shows a method for generating a current source proportional to $V_{swing}$. The circuit is similar to that of FIG. 10. The voltage $V_{swing}$ is applied to the non-inverting input of an op-amp 140. The inverting input of the op-amp is connected to ground through a resistor 142 of resistance $R_m$. The output of the op-amp drives the bases of a pair of PNP transistors 144 and 146, both of which have their emitters connected to the voltage source $V_{DD}$ through a resistance R. Consequently, both transistors operate with the same collector current. The collector of transistor 144 is connected to the inverting input of op-amp 140, providing a current $I_{FB}$ into node 148 equal and opposite to that produced in resistor 142 by the input signal—i.e., $I_{FB} = V_{swing}/R_m$. Thus, $I_{ref}$, the collector current of transistor 146 and the current at the DAC $V_{ref}$ terminal is also $V_{swing}/R_m$, as desired.

Figure 12:
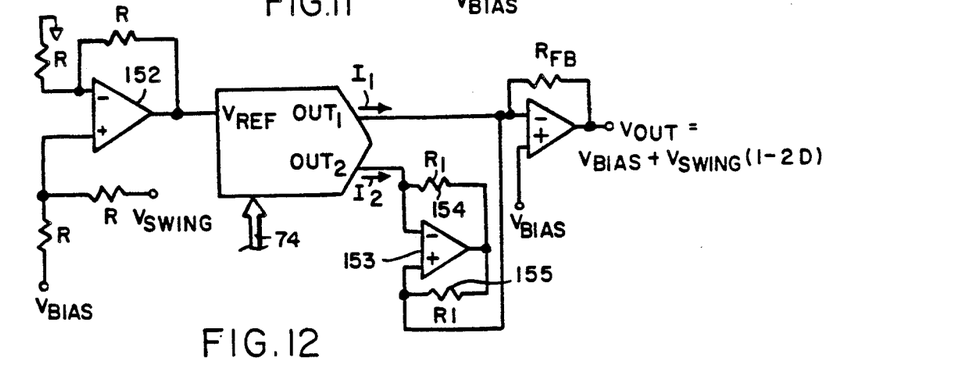
FIG. 12 is a schematic circuit diagram of a sixth embodiment of the invention, employing a CMOS DAC.
Figure 13:
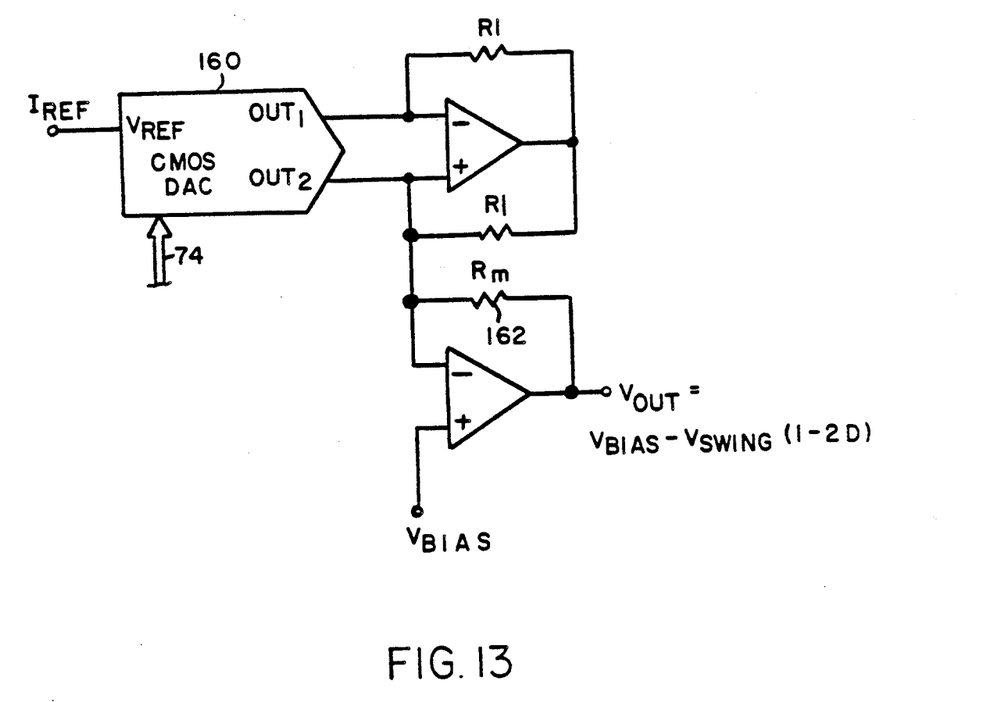
FIG. 13 is a schematic circuit diagram of an alternative embodiment of the circuit of FIG. 12, which may be used if it is required to produce a complementary transfer function to that of FIG. 12.

Another approach is shown in FIG. 12, where the source applied to the DAC's V terminal is a function of both $V_{bias}$ and $V_{swing}$, allowing both $V_{bias}$ and $V_{swing}$ to be ground referenced. Op-amp 154, with equal feedback resistors 154 and 155, serves as a current mirror.

One reason for using a PNP-based DAC is that their high output impedance makes them impervious to voltage changes on the OUT1 and OUT2 output lines. With the addition of an extra op-amp (relative to the embodiments of FIGS. 9 and 11, that is), it is possible to avoid voltage changes on the OUT1 and OUT2 lines for a CMOS DAC over the full digital code range, as well. A suitable circuit appears in FIG. 13. The reference terminal of DAC 160 may be driven with the current source of FIG. 11 or with the voltage reference source of FIG. 12, for example. If the resistance $R_m$ of feedback resistor 162 is actually the DAC ladder resistance, the desired output function is obtained. The complementary output function may be obtained, as with FIG. 9, by changing the direction of $I_{ref}$.

Consequently, several examples have been shown of circuits producing the transfer function $V_{out} = V_{bias} \pm V_{swing}(1-2D)$, where D represents the equivalent fractional value of the full scale DAC resolution indicated by the digital code applied to the DAC. Though the circuits are all different, they all have as a common thread the fact that (a) a function of the $V_{swing}$ signal (or a corresponding current) is applied to the DAC's reference input and (b) both $V_{bias}$ and $V_{swing}$ are positive voltages referenced to ground.

Having thus described several illustrative embodiments of the invention, it will readily be apparent that other embodiments as well as various alterations, modifications and improvements to the disclosed embodiments will occur to those skilled in the art. Accordingly, the foregoing embodiments have been presented by way of example only, and are not in any way intended to be limiting of the invention. The invention is limited only by the following claims and equivalents thereto.

What is claimed is:

1. A circuit for producing the function $V_{out} = V_{bias} + V_{swing}(1-2D)$, where D represents the decimal or fractional equivalent of a digital code and may range in value between zero and one, and $V_{bias}$ and $V_{swing}$ are input variables, the circuit comprising:
   a. a digital-to analog converter (DAC) having a reference voltage input, an analog ground terminal, a digital input port for receiving said digital code, and an analog output terminal;
   b. an operational amplifier having inverting and non-inverting inputs and an output;
   c. the DAC output being provided to the non inverting input of the operational amplifier through a resistor of resistance R;
   d. the non inverting input of the operational amplifier also being connected to one lead of a resistor of resistance 2R, the other lead of said resistor being connected to receive the input voltage $V_{bias}$;
   e. means for supplying a voltage $V_{swing}/2$ to the inverting input of the operational amplifier through an incremental resistance R;
   f. the output of the operational amplifier being connected to the inverting input of the operational amplifier through a resistor of resistance 2R; and
   g. the reference voltage input of the DAC being connected to receive the input voltage $V_{swing}$.

2. A circuit for producing the function $V_{out} = V_{bias} \pm V_{swing}(1-2D)$, where D represents the decimal or fractional equivalent of a digital code and may range in value between zero and one, and $V_{bias}$ and $V_{swing}$ are input variables, the circuit comprising:
   a. an MOS digital to analog converter (DAC) having a reference voltage terminal, a digital input port for receiving said digital code, a first output terminal for supplying a first analog output current, and a second output terminal for supplying a second analog output current;
   b. an operational amplifier having inverting and non-inverting inputs and an output;
   c. the second DAC output being connected to the non inverting input of the operational amplifier;
   d. the non-inverting input of the operational amplifier also being connected to one lead of a resistor of resistance $R_m$, the other lead of said resistor being connected to receive the input voltage $V_{bias}$;
   e. the inverting input of the operational amplifier being connected to the first output of the DAC and to the output of the operational amplifier through a resistor of resistance $R_m$; and
   f. means connected to the reference voltage terminal of the DAC a current equal to $V_{swing}/R_m$.

3. A circuit for producing the function $V_{out} = V_{bias} + V_{swing}(1-2D)$, where D represents the decimal or fractional equivalent of a digital code and may range in value between zero and one, and $V_{bias}$ and $V_{swing}$ are input variables, the circuit comprising:
   a. a digital to analog converter (DAC) having a reference voltage terminal, a digital input port for receiving said digital code, a first output terminal for supplying a first analog output current, and a second output terminal for supplying a second analog output current;
   b. an operational amplifier having inverting and non inverting inputs and an output;
   c. the second DAC output being connected to the non inverting input of the operational amplifier;
   d. the non inverting input of the operational amplifier also being connected to one lead of a resistor of resistance $R_m$, the other lead of said resistor being connected to receive the input voltage $V_{bias}$;
   e. the inverting input of the operational amplifier being connected to the first output of the DAC and to the output of the operational amplifier through a resistor of resistance $R_m$;
   f. the DAC comprising an R-2R resistive ladder, a drive transistor in series with each 2R resistor in the ladder and, for each leg of the 2R resistors, a switch responsive to the digital code to connect the series transistor collector current to the appropriate one of the first and second DAC outputs, and a reference transistor connected to the last R resistor in the ladder; and
   g. means connected to the reference transistor to cause the current through the last R resistor in the ladder to be substantially equal to $V_{swing}/R_m$.

* * * * *

UNITED STATES PATENT AND TRADEMARK OFFICE
CERTIFICATE OF CORRECTION

PATENT NO. : 4,990,916

DATED : February 5, 1991

INVENTOR(S) : John M. Wynne, et al.

It is certified that error appears in the above-identified patent and that said Letters Patent is hereby corrected as shown below:

Column 1, lines 54-55, change "1142D" to -- 1-2D --.

Column 2, lines 2-3, change "provide" to --provided--.

Column 2, line 52, after "$V_1$" insert --$(1 - 2^{-n})$ --.

Column 2, line 53, change "$1 - ^{-n}$" to -- $1-2^n$ --.

Column 3, line 19, change "drive" to --out--.

Column 3, lines 45-46, change "$V_{bias} \ V_{swing}$" to --$-V_{bias} \ -V_{swing}$--.

Column 3, line 51, change "for" to --form--.

Column 3, line 52, after "symmetrically" insert --about $V_{bias}$ as a function of $V_{swing}$--.

Column 3, line 55, change "for" to --form--.

Column 5, line 22, change "38" to --equivalent to resistor 68 in Fig. 6--.

Column 5, line 41, change " 6 13" to -- 6-13--.

UNITED STATES PATENT AND TRADEMARK OFFICE
CERTIFICATE OF CORRECTION

PATENT NO. : 4,990,916

DATED : February 5, 1991

INVENTOR(S) : John M. Wynne and Michael Byrne

It is certified that error appears in the above—identified patent and that said Letters Patent is hereby corrected as shown below:

Column 6, line 10, change "132 1" to --132-1--.

Column 6, line 38, change "V" to --$V_{ref}$--.

Column 6, line 40, change "154" to --153--.

Signed and Sealed this

Twenty-seventh Day of October, 1992

Attest:

DOUGLAS B. COMER

Attesting Officer

Acting Commissioner of Patents and Trademarks

UNITED STATES PATENT AND TRADEMARK OFFICE
CERTIFICATE OF CORRECTION

PATENT NO. : 4,990,916
DATED : February 5, 1991
INVENTOR(S) : John M. Wynne and Michael Byrne It is certified that error appears in the above-indentified patent and that said Letters Patent is hereby corrected as shown below:

Column 5 line 67, before "the voltage" insert —, via resistor 124,—.

In the Drawings, Fig. 5, should be deleted to be replaced with the drawing sheet, consisting of Fig. 5 as shown below: also changes have been made to Figs. 5, 10, and 11. In Fig. 5, the operational amplifier 46 has been redrawn to include a non-inverting input.

FIG. 5 PRIOR ART

Signed and Sealed this

Fourth Day of January, 1994

*Attest:*

BRUCE LEHMAN

*Attesting Officer*     Commissioner of Patents and Trademarks